(12) United States Patent
Kim

(10) Patent No.: US 9,627,458 B2
(45) Date of Patent: Apr. 18, 2017

(54) ORGANIC LIGHT-EMITTING DISPLAY PANEL AND METHOD OF FABRICATING THE SAME

(71) Applicant: SAMSUNG DISPLAY CO., LTD., Yongin, Gyeonggi-Do (KR)

(72) Inventor: Geun Tak Kim, Hwaseong-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/676,520

(22) Filed: Apr. 1, 2015

(65) Prior Publication Data
US 2016/0133676 A1 May 12, 2016

(30) Foreign Application Priority Data
Nov. 10, 2014 (KR) .................. 10-2014-0155421

(51) Int. Cl.
*H01L 27/32* (2006.01)
*H01L 51/00* (2006.01)

(52) U.S. Cl.
CPC ...... *H01L 27/3246* (2013.01); *H01L 27/3211* (2013.01); *H01L 27/3216* (2013.01); *H01L 51/0012* (2013.01)

(58) Field of Classification Search
CPC . H01L 51/56; H01L 51/0005; H01L 27/3246; H01L 2227/323; H01L 27/3211; H01L 51/0012; H01L 51/5265
See application file for complete search history.

(56) References Cited

U.S. PATENT DOCUMENTS

| 8,946,730 B2 * | 2/2015 | Okumoto | ............ H01L 27/3274 257/81 |
| 2005/0116632 A1 * | 6/2005 | Funamoto | ........... H01L 27/3246 313/506 |
| 2005/0225232 A1 * | 10/2005 | Boroson | ............. H01L 51/5265 313/504 |

(Continued)

FOREIGN PATENT DOCUMENTS

| JP | 2010-160945 A | 7/2010 |
| KR | 10-2007-0069063 A | 7/2007 |

(Continued)

*Primary Examiner* — Jaehwan Oh
(74) *Attorney, Agent, or Firm* — Lee & Morse, P.C.

(57) ABSTRACT

An organic light-emitting display panel and a method of fabricating the same, the panel including a base substrate; a first electrode layer including a plurality of first electrodes arranged on the base substrate; a pixel-defining layer including partition walls that extend from the base substrate and that define a plurality of pixels; an organic light-emitting layer including a plurality of organic light-emitting patterns in the pixels, respectively; and a second electrode layer on the organic light-emitting layer, wherein the organic light-emitting layer includes a plurality of primer patterns, the plurality of primer patterns being respectively formed in the pixels, being separate from one another, and respectively overlapping the first electrodes, at least one of the primer patterns has an area different from an area of the other primer patterns, and the primer patterns have an affinity for liquid that is higher than an affinity for liquid of the pixel-defining layer.

21 Claims, 18 Drawing Sheets

(56) References Cited

U.S. PATENT DOCUMENTS

| | | | | |
|---|---|---|---|---|
| 2010/0124603 | A1* | 5/2010 | Ito | H01L 27/3246 427/66 |
| 2010/0193817 | A1* | 8/2010 | Amamiya | H01L 27/3246 257/98 |
| 2011/0014389 | A1* | 1/2011 | Ito | H01L 51/0005 427/535 |
| 2012/0319089 | A1* | 12/2012 | Shin | H01L 51/0014 257/40 |
| 2013/0334513 | A1* | 12/2013 | Okumoto | H01L 27/3274 257/40 |
| 2014/0034933 | A1* | 2/2014 | Okumoto | H01L 27/1225 257/40 |
| 2014/0065750 | A1* | 3/2014 | Harikrishna Mohan | H01L 51/5072 438/35 |
| 2014/0070175 | A1* | 3/2014 | Kang | H01L 51/52 257/40 |
| 2014/0197396 | A1* | 7/2014 | Madigan | H01L 51/0005 257/40 |
| 2014/0255661 | A1* | 9/2014 | Masrud | B05D 1/28 428/195.1 |

FOREIGN PATENT DOCUMENTS

| | | |
|---|---|---|
| KR | 10-2010-0127246 A | 12/2010 |
| KR | 10-2014-0033415 A | 3/2014 |

* cited by examiner

ORGANIC LIGHT-EMITTING DISPLAY PANEL AND METHOD OF FABRICATING THE SAME

CROSS-REFERENCE TO RELATED APPLICATION

Korean Patent Application No. 10-2014-0155421, filed on Nov. 10, 2014, in the Korean Intellectual Property Office, and entitled: "Organic Light-Emitting Display Panel and Method of Fabricating the Same," is incorporated by reference herein in its entirety.

BACKGROUND

1. Field

Embodiments relate to an organic light-emitting display panel and a method of fabricating the organic light-emitting display panel.

2. Description of the Related Art

Organic light-emitting display devices, which are flat panel display devices, are increasingly replacing LCDs, which have been widespread. Organic light-emitting display devices, unlike LCDs, display images by generating light themselves, and thus do not require backlight units, which can generate light. Thus, organic light-emitting display devices may be more suitable than LCDs in the fabrication of thin display devices. Also, organic light-emitting display devices have excellent response properties. Due to these and other benefits, organic light-emitting display devices are increasingly expanding their usage as next-generation display devices.

SUMMARY

Embodiments are directed to an organic light-emitting display panel and a method of fabricating the organic light-emitting display panel.

The embodiments may be realized by providing an organic light-emitting display panel including a base substrate; a first electrode layer including a plurality of first electrodes arranged on the base substrate; a pixel-defining layer including partition walls that extend from the base substrate and that define a plurality of pixels; an organic light-emitting layer including a plurality of organic light-emitting patterns in the pixels, respectively; and a second electrode layer on the organic light-emitting layer, wherein the organic light-emitting layer includes a plurality of primer patterns, the plurality of primer patterns being respectively formed in the pixels, being separate from one another, and respectively overlapping the first electrodes, at least one of the primer patterns has an area different area from an area of the other primer patterns, and the primer patterns have an affinity for liquid that is higher than an affinity for liquid of the pixel-defining layer.

The organic light-emitting layer may include first through third organic light-emitting patterns, which alternately appear at least once, and at least one of the first through third organic light-emitting patterns may have a thickness different from a thickness of the other organic light-emitting patterns.

A thickness of the first organic light-emitting pattern may be represented by Equation (1):

$$L1 = (\lambda R/2) \times m \quad (1)$$

in which L1 denotes the thickness of the first organic light-emitting pattern, λR denotes the wavelength of red light, and m is a natural number.

A thickness of the second organic light-emitting pattern may be represented by Equation (2):

$$L2 = (\lambda G/2) \times m \quad (2)$$

in which L2 denotes the thickness of the second organic light-emitting pattern, λG denotes the wavelength of green light, and m is a natural number.

A thickness of the third organic light-emitting pattern may be represented by Equation (3):

$$L3 = (\lambda B/2) \times m \quad (3)$$

in which L3 denotes the thickness of the second organic light-emitting pattern, λB denotes the wavelength of blue light, and m is a natural number.

The organic light-emitting layer may further include a hole injection layer between the primer patterns and the first electrodes.

Between the primer patterns and the second electrode layer, the organic light-emitting layer may further include at least one of an emission layer, a hole transport layer, an electron injection layer, and an electron transport layer.

At least one of the emission layer, the hole transport layer, the electron injection layer and the electron transport layer may have liquid-philic properties.

The primer patterns may include first through third primer patterns, which alternately appear at least once, and the first through third primer patterns may have areas that are different from one another.

At least one of the first through third primer patterns may partially overlap the pixel-defining layer in a cross-sectional view along a plane parallel to the base substrate.

Two of the first through third primer patterns may partially overlap the pixel-defining layer in a cross-sectional view along a plane parallel to the base substrate, and one of the two primer patterns may have a larger area of contact with the pixel-defining layer than the other primer pattern.

The embodiments may be realized by providing a method of fabricating an organic light-emitting display panel, the method including providing a base substrate including a plurality of first electrodes thereon; forming a pixel-defining layer such that the pixel-defining layer includes partition walls that define a plurality of pixels and that extend from the base substrate that includes the plurality of first electrodes thereon; forming an organic light-emitting layer such that the organic light-emitting layer includes a plurality of organic light-emitting patterns that are respectively formed in the pixels; and forming a second electrode layer on the organic light-emitting layer, wherein the organic light-emitting layer includes a plurality of primer patterns, which are formed separately in the pixels, respectively, and that overlap the first electrodes, respectively, at least one of the primer patterns has an area that is different from an area of the other primer patterns, and the primer patterns have an affinity for liquid that is higher than an affinity for liquid of the pixel-defining layer.

The method may further include forming a hole injection layer such that the hole injection layer covers the first electrodes and the pixel-defining layer and is between the base substrate and the primer patterns.

Forming the organic light-emitting layer may include applying a primer layer that includes a liquid-philic material; patterning the primer layer by using a mask, the mask including light-transmitting areas corresponding to the primer patterns; and removing portions of the primer layer except for portions corresponding with the primer patterns.

The organic light-emitting layer may include first through third organic light-emitting patterns, which alternately appear at least once, and at least one of the first through third organic light-emitting patterns may have a thickness different from a thickness of the other organic light-emitting patterns.

Forming the organic light-emitting layer may include forming, on the primer patterns, at least one of an emission layer, a hole transport layer, an electron injection layer, and an electron transport layer.

Forming the organic light-emitting layer may further include forming at least one of the emission layer, hole transport layer, electron injection layer, and the electron transport layer by using a single nozzle.

The pixels may be arranged in a matrix form, and at least one of the hole transport layer, the electron injection layer, and the electron transport layer may extend in a row direction or a column direction.

The primer patterns may include first through third primer patterns, which alternately appear at least once, and at least one of the first through third primer patterns may have an area that is different from an area of the other primer patterns.

At least one of the first through third primer patterns may partially overlap the pixel-defining layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
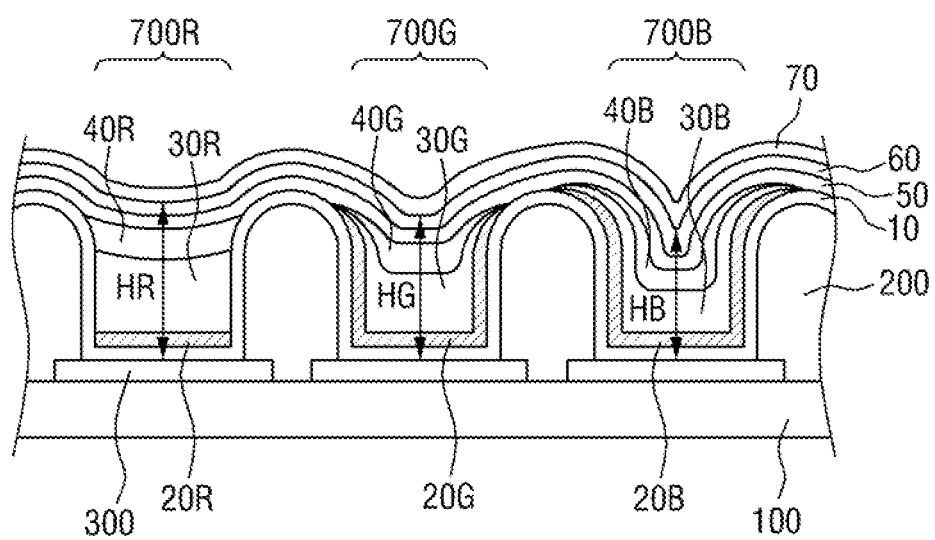
FIG. 1 illustrates a cross-sectional view of an organic light-emitting display panel according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

The term "on" that is used to designate that an element is on another element located on a different layer or a layer includes both a case where an element is located directly on another element or a layer and a case where an element is located on another element via another layer or still another element.

Although the terms "first", "second", and so forth are used to describe diverse constituent elements, such constituent elements are not limited by the terms. The terms are used only to discriminate a constituent element from another constituent element. Accordingly, in the following description, a first constituent element may be a second constituent element.

Figure 2:
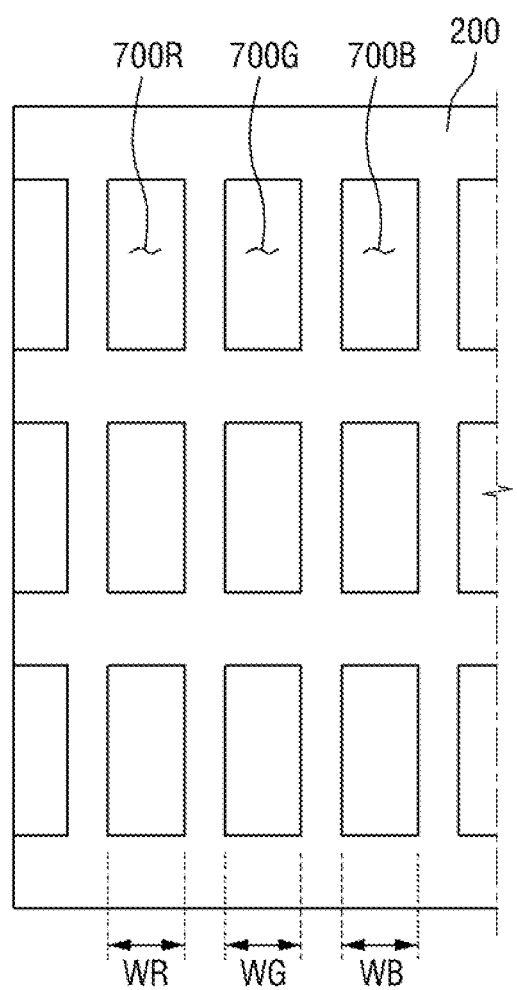
FIG. 2 illustrates a plan view of the organic light-emitting display panel of FIG. 1.

FIG. 1 illustrates a cross-sectional view of an organic light-emitting display panel according to an exemplary embodiment, and FIG. 2 illustrates a plan view of the organic light-emitting display panel of FIG. 1.

Referring to FIGS. 1 and 2, an organic light-emitting display panel according to an exemplary embodiment may include a base substrate 100, a plurality of first electrodes 300 (arranged on the based substrate 100), a pixel-defining layer 200 (including partition walls that protrude from the base substrate 100 and that define pixels 700R, 700G, and 700B), an organic light-emitting layer (including a plurality of organic light-emitting patterns, respectively, that are formed in the pixels 700R, 700G, and 700B, respectively, and that are separate or spaced apart from one another), and a second electrode layer 70 (on the organic light-emitting layer).

The organic light-emitting layer may include the organic light-emitting patterns, respectively, which are formed in the pixels 700R, 700G, and 700B, respectively, to be separate from one another. The organic light-emitting patterns may include lyophilic or primer patterns 20R, 20G, and 20B, hole transport layers 30R, 30G, and 30B on the primer patterns 20R, 20G, and 20B, respectively, and which are located in, e.g., in an area defined by, the pixel-defining layer 200, emission layers 40R, 40G and 40B on the hole transport layers 30R, 30G and 30B, respectively, an electron transport layer 50 on the emission layers 40R, 40G and 40B, an electron injection layer 60 on the electron transport layer 50, and the second electrode layer 70 on the electron injection layer 60.

The first electrodes 300 may be collectively referred to as a first electrode layer. The primer patterns 20R, 20G, and 20B may be formed in the pixels 700R, 700G, and 700B, respectively, to be separate or spaced apart from one another. The primer patterns 20R, 20G and 20B, the hole transport layers 30R, 30G and 30B, the emission layers 40R, 40G and 40B, the electron transport layer 50, and the electron injection layer 60 may be collectively referred to as the organic light-emitting layer.

In an implementation, the base substrate 100 may be formed of glass, quartz, or a transparent plastic material.

The pixels 700R, 700G, and 700B may be defined or separated by the pixel-defining layer 200, which includes the partition walls that protrude or extend from the base substrate 100. The partition walls may be formed in the shape of banks. The partition walls may be formed along a circumference or perimeter of each of the first electrodes 300 (which are formed in the pixels 700R, 700G, and 700B, respectively), to partially overlap each of the first electrodes 300. Thus, the partition walls may define openings of the pixels 700R, 700G, and 700B. In an implementation, the partition walls may be formed of an organic material, e.g., an acrylic resin, an epoxy resin, or a photosensitive polyimide, or an inorganic material, such as glass or liquid glass. In an implementation, the partition walls may be formed of, e.g., black resist, which may be obtained by the organic material or the inorganic material with carbon black, so as to improve contrast.

The pixels 700R, 700G, and 700B may be arranged in a matrix form, as illustrated in FIG. 2. The pixels 700R, 700G, and 700B may have the same size, i.e., the same length and width. For example, the pixels 700R, 700G, and 700B may have the same length in a column direction, and lengths of the pixels 700R, 700G, and 700B in a row direction, i.e., widths WR, WG, and WB of the pixels 700R, 700G, and 700B, may be identical.

Light emitted from the organic light-emitting layer may be released from the openings of the pixels 700R, 700G, and 700B, which are defined by the pixel-defining layer 200. As a result, light may be emitted from the same pixel areas in a horizontal cross-sectional view.

The organic light-emitting layer may be formed in the pixels 700R, 700G, and 700B, respectively, and at least one of the primer patterns 20R, 20G, and 20B may have an area (e.g., surface area) different from the area of the other primer patterns. For example, in response to there being first, second, and third pixels 700R, 700G, and 700B, the primer patterns of the first, second, and third pixels 700R, 700G, and 700B may be referred to as first, second, and third primer patterns 20R, 20G and 20B, respectively. At least one of the first, second, and third primer patterns 20R, 20G, and 20B may have a different area from the other primer patterns. In an implementation, the area of the first, second, and third primer patterns 20R, 20G, and 20B may, e.g., gradually, increase from the first primer pattern 20R to the third primer pattern 20B.

The primer patterns 20R, 20G, and 20B may have different areas, and the hole transport layers 30R, 30G and 30B, the emission layers 40R, 40G and 40B, the electron transport layer 50, and/or the electron injection layer 60 may be formed on the primer patterns 20R, 20G and 20B to spread to different extents among the primer patterns 20R, 20G and 20B.

Accordingly, in response to even a same amount of liquid or solution, e.g., a number of liquid or solution drops, for forming the hole transport layers 30R, 30G and 30B, the emission layers 40R, 40G and 40B, the electron transport layer 50, or the electron injection layer 60 being discharged or provided onto the primer patterns 20R, 20G and 20B, a degree to which the liquid drops or solution spreads may be varied due to the differences in area among the primer patterns 20R, 20G and 20B. As a result, the organic light-emitting layers of the respective pixels 700R, 700B and 700R may have different thicknesses. Therefore, an organic light-emitting layer with a resonant structure may be formed in each pixel.

For example, the organic light-emitting layer may include first, second and third organic light-emitting patterns, which may alternately appear at least once, and at least one of the first, second and third organic light-emitting patterns may have a thickness different from the other organic light-emitting patterns.

As illustrated in FIG. 1, the thickness of the organic light-emitting patterns may be a distance from the first electrode layer 300 to the second electrode layer 70. For example, the first, second and third organic light-emitting patterns may be formed in the first, second and third pixels 700R, 700G and 700B, respectively, and may have thicknesses HR, HG and HB, respectively, which differ from one another. In an implementation, e.g., as illustrated in FIG. 1, the thicknesses may decrease from the thickness HR of the first organic light-emitting pattern to the thickness HB of the third organic light-emitting pattern.

In response to the same amounts of organic materials being introduced during forming of the organic light-emitting patterns of the organic light-emitting layer, the degree to which the organic materials spread may be varied because of the differences between the areas of the primer patterns 20R, 20G and 20B. As a result, the thickness of the organic materials in the first, second and third pixels 700R, 700G and 700B, respectively, may be varied. Accordingly, the thickness of the organic light-emitting patterns may be adjusted as desired, even when the same amounts of organic materials are injected with the use of a single nozzle.

In an implementation, the thickness HR of the first organic light-emitting pattern may be represented by Equation (1).

$$L1 = (\lambda R/2) \times m \quad (1)$$

In Equation (1), L1 denotes the thickness HR of the first organic light-emitting pattern, λR denotes the wavelength of red light, and m is a natural number.

For example, red light may have a wavelength of 600 nm to 670 nm with a peak at about 618 nm to about 635 nm. According to Equation (1), the length of an optical path of the first organic light-emitting pattern may be a natural number multiple of 300 nm to 335 nm. For example, the thickness HR of the first organic light-emitting pattern may be determined, as indicated in Equation (1), the first organic light-emitting pattern may have a resonant structure with respect to red light wavelengths, and may thus emit red light with a narrow peak. Accordingly, high-purity red light may be realized.

The thickness HG of the second organic light-emitting pattern may be represented by Equation (2).

$$L2 = (\lambda G/2) \times m \quad (2)$$

In Equation (2), L2 denotes the thickness HG of the second organic light-emitting pattern, λG denotes the wavelength of green light, and m is a natural number.

For example, green light may have a wavelength of 500 nm to 570 nm with a peak at about 516 nm to about 533 nm. According to Equation (2), the length of an optical path of the second organic light-emitting pattern may be a natural number multiple of 250 nm to 285 nm.

The thickness HG of the second organic light-emitting pattern may be determined, as indicated in Equation (2), the second organic light-emitting pattern may have a resonant structure with respect to green light wavelengths, and may thus emit green light with a narrow peak. Accordingly, high-purity green light may be realized.

The thickness HB of the third organic light-emitting pattern may be represented by Equation (3).

$$L3 = (\lambda B/2) \times m \quad (3)$$

In Equation (3), L3 denotes the thickness HB of the second organic light-emitting pattern, λB denotes the wavelength of blue light, and m is a natural number.

For example, blue light may have a wavelength of 420 nm to 480 nm with a peak at about 440 nm to about 465 nm. According to Equation (3), the length of an optical path of the third organic light-emitting pattern may be a natural number multiple of 250 nm to 285 nm.

The thickness FIB of the third organic light-emitting pattern may be determined, as indicated in Equation (3), the third organic light-emitting pattern may have a resonant structure with respect to blue light wavelengths, and may thus emit blue light with a narrow peak. Accordingly, high-purity blue light may be realized.

The term "optical length", as used herein, means the distance between the first electrode layer 300 and the second electrode layer 70. The organic light-emitting patterns may be formed between the first electrode layer 300 and the second electrode layer 70, and the term "optical length" may also refer to the thicknesses FIR, HG and HB of the organic light-emitting patterns.

If, according to the Fabry-Perot optical cavity principle, each of the lengths of the optical paths of the organic light-emitting patterns is designed to be a natural number (m) multiple of half the wavelength λa (where λa is λR, λG or λB) of light desired to be emitted, the resonant structures of the organic light-emitting patterns may transmit light therethrough with the wavelength λa and reflect light with a wavelength other than the wavelength λa. As a result, light with the wavelength λa may be emitted from each of the organic light-emitting patterns through multiple reflections within the corresponding organic light-emitting pattern. Accordingly, the purity of light with the wavelength λa may be improved. As a result, the wavelength of light within a desired wavelength range may be sharpened. Also, light near a desired wavelength peak may be reflected. Therefore, light of a high-purity color may be emitted.

To adjust the lengths of the optical paths of the organic light-emitting patterns, the thicknesses of the organic light-emitting patterns may be adjusted, e.g., deliberately or arbitrarily. In an implementation, the thicknesses of the organic light-emitting patterns may be adjusted by adjusting the areas of the primer patterns 20R, 20G and 20B while using the same amounts of organic light-emitting materials. Accordingly, it is possible to form the resonant structures of the organic light-emitting patterns through simple processes.

In an implementation, to configure each of the organic light-emitting patterns to have a resonant structure and thus to realize a high-purity color, at least one of the first electrode layer 300 and the second electrode layer 70 may be formed of a semitransparent material or a reflective member. For example, at least one of the first electrode layer 300 and the second electrode layer 70 may be formed of a transparent conductive material such as indium tin oxide (ITO) or indium zinc oxide (IZO).

For example, the first electrodes 300 may be pixel electrodes on the organic light-emitting display panel, and the pixel electrodes may be the anode electrodes of the pixels 700R, 700G and 700B. For example, in response to the organic light-emitting display panel being applied a front emission-type organic light-emitting display device, the first electrodes 300 may be used as pixel electrodes, and may include a metal layer formed of a metal such as aluminum (Al) so as to have reflective properties.

In response to the organic light-emitting display panel being applied a rear emission-type organic light-emitting display device, the first electrodes 300 may be used as pixel electrodes, and may include a transparent conductive layer formed of ITO or IZO so as to have transmissive properties. Alternatively, the first electrodes 300 may include not only a transparent conductive layer, but also a metal layer reflecting light, so as to have semi-transmissive properties. In an implementation, the first electrodes 300 may be formed of a material with excellent reflectivity such as Al, an Al alloy, silver (Ag) or an Ag alloy, and the material of the first electrodes 300 may be varied depending on the emission type of an organic light-emitting display device to which the organic light-emitting display panel is applied.

In an implementation, as illustrated in FIG. 1, the first electrodes 300 may protrude or extend from the base substrate 100. In an implementation, a plurality of recesses may be formed on the base substrate 100, and the first electrodes 300 may be inserted in the recesses, respectively, and various modifications may be made to the first electrodes 300.

The organic light-emitting layer may include the primer patterns 20R, 20G and 20B and may also include a hole injection layer 10, which may be, e.g., commonly, disposed among or on the first electrodes 300. In an implementation, the hole injection layer 10 may cover not only the base substrate 100, but also the pixel-defining layer 200 and the first electrode layer 300, which are on the base substrate 100. In an implementation, the hole injection layer 10 may be formed only in each of the pixels 700R, 700G and 700B, which are defined by the pixel-defining layer 200, or may partially overlap the pixel-defining layer 200 when viewed in a horizontal cross-sectional view or in a plan view.

Holes may be injected through or from the first electrode layer 300. The holes injected from the first electrode layer 300 may be provided to the primer patterns 20R, 20G and 20B and the rest of the organic light-emitting layer through the primer patterns 20R, 20G and 20B. For example, the holes injected through or from the first electrode layer 300 may move to the emission layers 40R, 40G and 40B via the primer patterns 20R, 20G and 20B and the hole transport layers 30R, 30G and 30B.

Electrons may be provided by the second electrode layer 70. The electrons may move to the emission layers 40R, 40G and 40B via the electron injection layer 60 and the electron transport layer 50. Accordingly, the holes provided by the first electrode layer 300 and the electrons provided by the second electrode layer 70 may combine together in the emission layers 40R, 40G and 40B and, due to the energy resulting from the combination of the holes and the electrons, light may be emitted.

For example, in response to an electric field being formed between the first electrode layer 300 and the second electrode layer 70, holes may be injected into the emission layers 40R, 40G and 40B from the first electrode layer 300, and electrons may be injected into the emission layers 40R, 40G and 40B from the second electrode layer 70. The holes and the electrons may combine together, thereby generating excitons. Light corresponding to the energy between the holes and the electrons may be generated by the excitons.

The hole injection layer 10 may include suitable hole injection materials.

As mentioned above, the organic light-emitting layer may include the primer patterns 20R, 20G and 20B, and may also include at least one of the hole transport layers 30R, 30G and 30B, the emission layers 40R, 40G and 40B, the electron injection layer 60 and the electron transport layer 50 between the primer patterns 20R, 20G and 20B and the second electrode layer 70. In an implementation, the organic light-emitting layer, as illustrated in FIG. 1, may have a stack structure in which the hole transport layers 30R, 30G and 30B, the emission layers 40R, 40G and 40B, the electron transport layer 50 and the electron injection layer 60 are sequentially deposited on the primer patterns 20R, 20G and 20B. In an implementation, various modifications may be made to the stack structure of FIG. 1, e.g., by not forming some of the layers of the stack structure of FIG. 1 or varying the arrangement of the layers of the stack structure of FIG. 1. In an implementation, the organic light-emitting layer may be formed to have a tandem structure.

In an implementation, the hole transport layers 30R, 30G and 30B may be formed of, e.g., a mixture of polyethylene dioxythiophene and polystyrene sulfonic acid, or copper phthalocyanine. The hole transport layers 30R, 30G and 30B may receive holes from the first electrode layer 300, and may transport the holes. The hole transport layers 30R, 30G and 30B may help improve the light emission efficiency of an organic light-emitting display device.

In an implementation, the emission layers 40R, 40G and 40B may be formed of an organic compound, e.g., a polymer organic compound. For example, the emission layers 40R, 40G and 40B may be formed of poly(paraphenylene vinylene) (PPV) or a derivative thereof, poly(alkyllythiophene) such as poly(2,5-thienylene vinylene) (PTV), polyarylene vinylene such as poly(2,5-furylene vinylene) (PFV), poly(para-phenylene) or poly(alkyl fluorine), a pyrazoline dimer, quinolizine carbonic acid, benzopyrylium perchlorate, rubrene, a phenanthroline europium complex, and these organic compounds may be used alone or together with one another. In an implementation, the emission layers 40R, 40G and 40B may be doped with at least one fluorescent dye.

The electron transport layer 50 may be formed on the emission layers 40R, 40G and 40B, and the electron injection layer 60 may be formed on the electron transport layer 50. The electron transport layer 50 and the electron injection layer 60 may include suitable electron transport materials and/or electron injection materials, respectively.

In an implementation, the emission layers 40R, 40G and 40B, as illustrated in FIG. 1, may be formed in the pixels 700R, 700G and 700B, respectively, to be separate from one another. In an implementation, the electron transport layer 50 and the electron injection layer 60, as illustrated in FIG. 1, may cover not only the top surfaces of the emission layers 40R, 40G and 40B, but also the pixel-defining layer 200. In an implementation, various modifications can be made to the organic light-emitting layer by, e.g., forming each layer of the organic light-emitting layer in the pixels 700R, 700G and 700B, respectively.

An image created by the organic light-emitting display panel may be displayed by light emitted from the emission layers 40R, 40G and 40B, which are formed in the pixels 700R, 700G and 700B, respectively, to be separate from one another, and may thus not be able to be affected by the electron transport layer 50 and the electron injection layer 60, which may cover the top of the pixel-defining layer 200.

At least one of the hole transport layers 30R, 30G and 30B, the emission layers 40R, 40G and 40B, the electron injection layer 60 and the electron transport layer 50 may have lyophilic or liquid-philic properties. In an implementation, the primer patterns 20R, 20G, and 20B may also have liquid-philic properties. For example, the hole transport layers 30R, 30G and 30B and the emission layers 40R, 40G and 40B may have liquid-philic properties. In this example, the surface energy of the hole transport layers 30R, 30G and 30B and the emission layers 40R, 40G and 40B may not differ much from the surface energy of the primer patterns 20R, 20G and 20B. As a result, the hole transport layers 30R, 30G and 30B may be easily formed, and attached, on the primer patterns 20R, 20G and 20B, respectively.

For example, the primer patterns 20R, 20G, and 20B may exhibit an affinity for liquid. In an implementation, at least one of the hole transport layers 30R, 30G and 30B, the emission layers 40R, 40G and 40B, the electron injection layer 60 and the electron transport layer 50 may exhibit an affinity for liquid, e.g., may exhibit a similar affinity for liquid that is exhibited by the primer patterns 20R, 20G, and 20B.

In an implementation, the pixel-defining layer 200 may have lyophobic or liquid-repelling properties, and may have higher surface energy than the primer patterns 20R, 20G and 20B. Accordingly, layers of the organic light-emitting layer that are formed on the primer patterns 20R, 20G and 20B may be in proper contact with the primer patterns 20R, 20G and 20B, but not with the pixel-defining layer 200. Thus, even the same amounts of organic material used may result in different areas of contact between the organic material and the primer patterns 20R, 20G and 20B due to the differences among the areas of the primer patterns 20R, 20G and 20B.

As a result, the organic light-emitting layer may be formed in the pixels 700R, 700G and 700B, respectively, to have different thicknesses. For example, the primer patterns 20R, 20G and 20B may exhibit an affinity for the materials for forming at least one of the hole transport layers 30R, 30G and 30B, the emission layers 40R, 40G and 40B, the electron injection layer 60 and the electron transport layer 50, e.g., an affinity for a liquid, solution, or dispersion for forming at least one of the hole transport layers 30R, 30G and 30B, the emission layers 40R, 40G and 40B. For example, the pixel-defining layer 200 and/or the hole injection layer 10 may exhibit a repulsion to the materials for forming at least one of the hole transport layers 30R, 30G and 30B, the emission layers 40R, 40G and 40B, the electron injection layer 60 and the electron transport layer 50, e.g., a repulsion to the liquid, solution, or dispersion for forming at least one of the hole transport layers 30R, 30G and 30B, the emission layers 40R, 40G and 40B.

If the layers of the organic light-emitting layer (and/or the materials for forming the same) on the primer patterns 20R, 20G and 20B all have liquid-philic patterns, they may sequentially be formed in each of the pixels 700R, 700G and 700B to have different thicknesses in different pixels. As a result, the organic light-emitting patterns may have different thicknesses from one another. Accordingly, a plurality of organic light-emitting patterns, each having a resonant structure, may be formed by using the same amounts of organic materials. As a result, an organic light-emitting display panel with high color purity may be fabricated with ease.

The primer patterns 20R, 20G and 20B will hereinafter be described in further detail. The primer patterns 20R, 20G and 20B may include the first, second and third primer patterns 20R, 20G and 20B, which alternately or sequentially appear at least once and have different areas from one another.

At least one of the first, second and third primer patterns 20R, 20G and 20B may partially overlap the pixel-defining layer 200 in a cross-sectional view along a plane parallel to the base substrate 100 or in a plan view. The term "a plane parallel to the base substrate 100", as used herein, may indicate a plane parallel to a surface formed by the base substrate 100. The expression "the first, second and third primer patterns 20R, 20G and 20B partially overlapping the pixel-defining layer 200", as used herein, may mean that the first, second and third primer patterns 20R, 20G and 20B may be formed even on the pixel-defining layer 200 beyond the pixels 700R, 700G and 700B, respectively, defined by the pixel-defining layer 200, when viewed from above the base substrate 100.

For example, the pixel-defining layer 200 may include partition walls that protrude or extend from the base substrate 100 to define the pixels 700R, 700G and 700B. One of the first, second and third primer patterns 20R, 20G and 20B may be formed even on one of the partition walls. Accordingly, even though the pixels 700R, 700G and 700B may have the same opening area, the first, second and third primer patterns 20R, 20G and 20B may be formed in the pixels 700R, 700G and 700B, respectively, to have different areas from one another.

Two of the first, second and third primer patterns 20R, 20G and 20B may partially overlap the pixel-defining layer 200 in a cross-sectional view along a plane parallel to the base substrate 100 or in a plan view, and the overlapping area of one of the two primer patterns and the pixel-defining layer 200 may be relatively larger than the overlapping area of the other primer pattern and the pixel-defining layer 200.

For example, as illustrated in FIG. 1, the first primer pattern 20R may be formed only in the first pixel 700R, and the second and third primer patterns 20G and 20B may be formed to extend from inside the openings of the second and third pixels 700G and 700B, respectively, to over or on the top of the pixel-defining layer 200. In an implementation, the overlapping area of the third primer pattern 20B and the pixel-defining layer 200 may be larger than the overlapping area of the second primer pattern 20G and the pixel-defining layer 200.

According to the exemplary embodiment of FIGS. 1 and 2, an organic light-emitting display device including the organic light-emitting display panel that has been described with reference to FIGS. 1 and 2 may be provided.

A method of fabricating an organic light-emitting display panel, according to an exemplary embodiment will hereinafter be described. Repeated descriptions of details that have already been explained in the description of the organic light-emitting display panel according to an exemplary embodiment may be omitted.

The method of fabricating an organic light-emitting display panel, according to an exemplary embodiment may include: providing a base substrate that includes a plurality of first electrodes thereon; forming a pixel-defining layer on the base substrate (including the plurality of first electrodes), wherein the pixel-defining layer protrudes or extends from the base substrate and defines a plurality of pixels; forming an organic light-emitting layer (including a plurality of light-emitting patterns, which are formed in the pixels, respectively); and forming a second electrode layer on the organic light-emitting layer.

Figure 3:
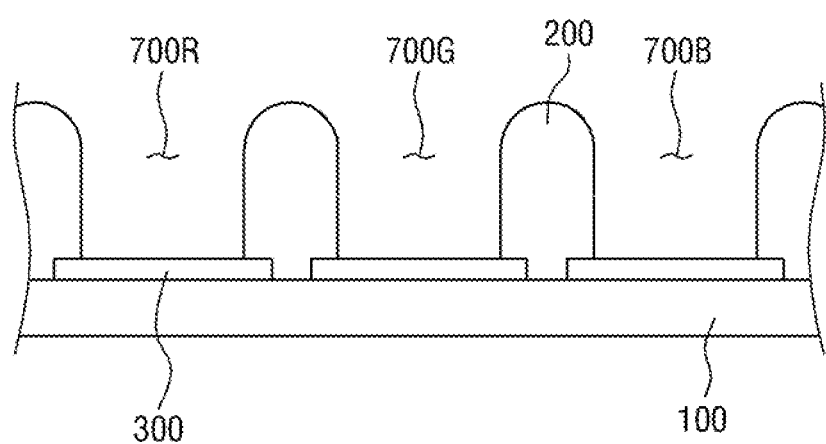
FIGS. 3 through 18 illustrate schematic diagrams of stages in a method of fabricating an organic light-emitting display panel, according to an exemplary embodiment.

For example, referring to FIG. 3, a step of forming a pixel-defining layer 200 on a base substrate 100 (including a plurality of first electrodes 300 thereon) to include partition walls that protrude or extend from the base substrate 100 and that define pixels 700R, 700G and 700B may be performed. The pixel-defining layer 200 may protrude and may partially overlap each of the first electrodes 300. The pixels 700R, 700G and 700B may be defined by openings formed by the pixel-defining layer 200.

Figure 4:
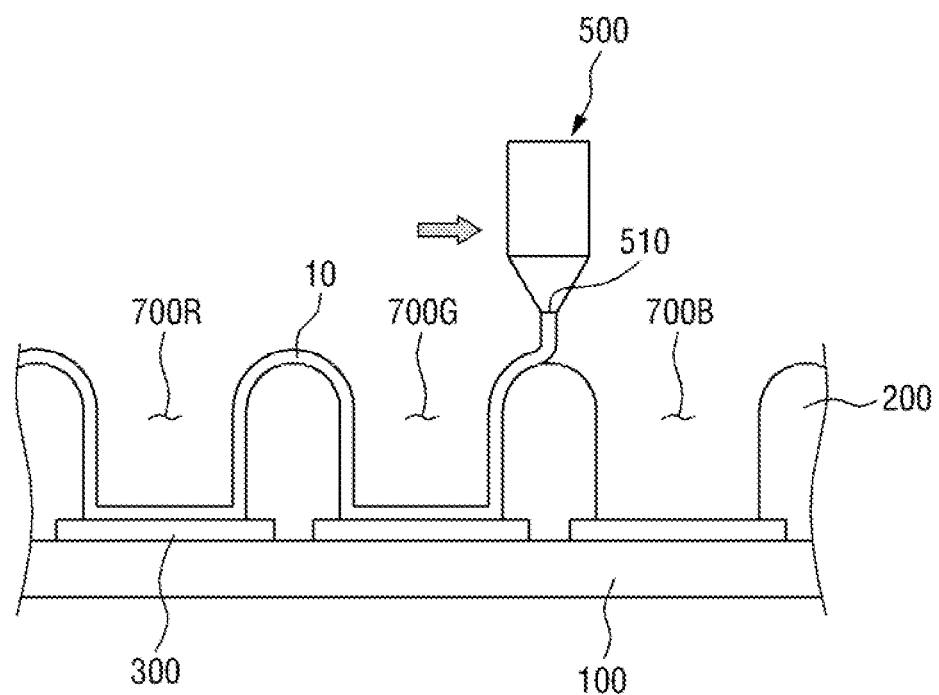
Figure 5:
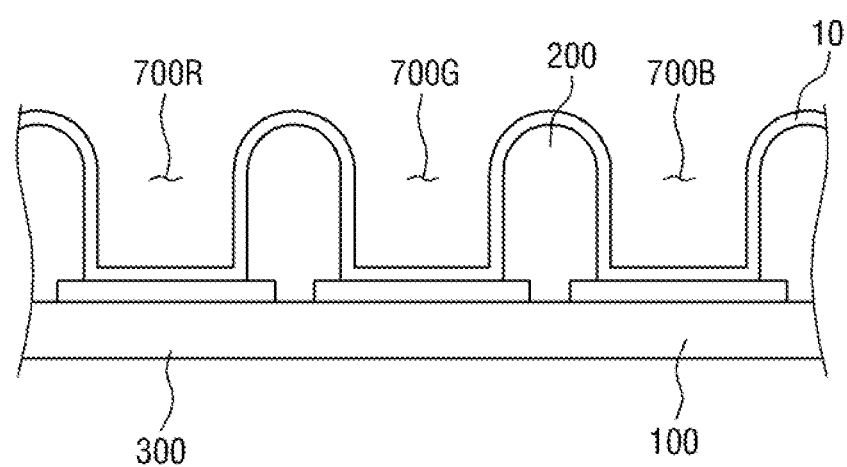

A step of forming an organic light-emitting layer, which includes a plurality of organic light-emitting patterns in the pixels 700R, 700G and 700B, respectively, may be performed. In an implementation, referring to FIG. 4, a material for forming a hole injection layer 10 may be discharged from a slit 500. As a result, referring to FIG. 5, the hole injection layer 10 may cover the base substrate 100, the pixel-defining layer 200 and the first electrodes 300. The hole injection layer 10 may not only cover the first electrodes layer 300 and the pixel-defining layer 200, but may also be between a plurality of primer patterns (to be formed on the base substrate 100).

In an implementation, the hole injection layer 10 may be formed to a uniform thickness by being discharged from a discharging outlet 510 of the slit 500. In an implementation, the hole injection layer 10 may be formed only inside each of the pixels 700R, 700G and 700B, if desired. In an implementation, the hole injection layer 10 may be formed by various methods, other than a method involving the use of the slit 500, such as a method involving the use of a nozzle, or a deposition or sputtering method.

Figure 6:
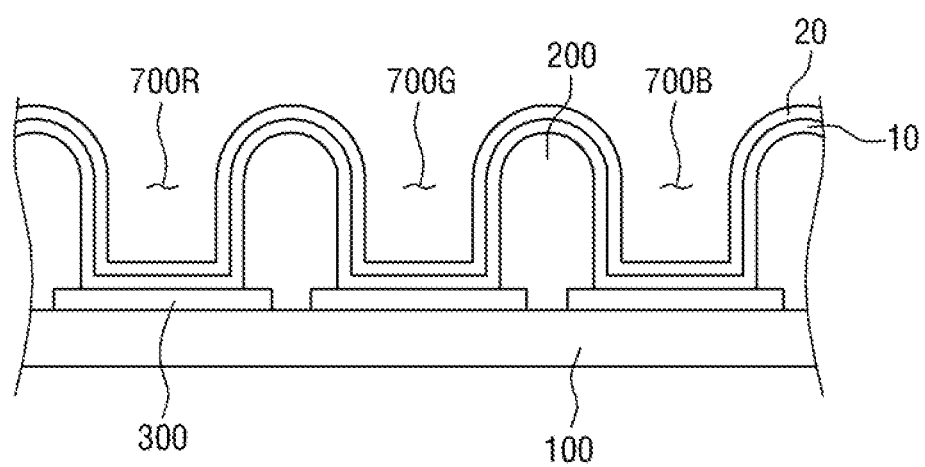

Referring to FIG. 6, the step of forming the organic light-emitting layer may include applying a primer layer 20, which includes a liquid-philic material, on the hole injection layer 10.

Figure 7:
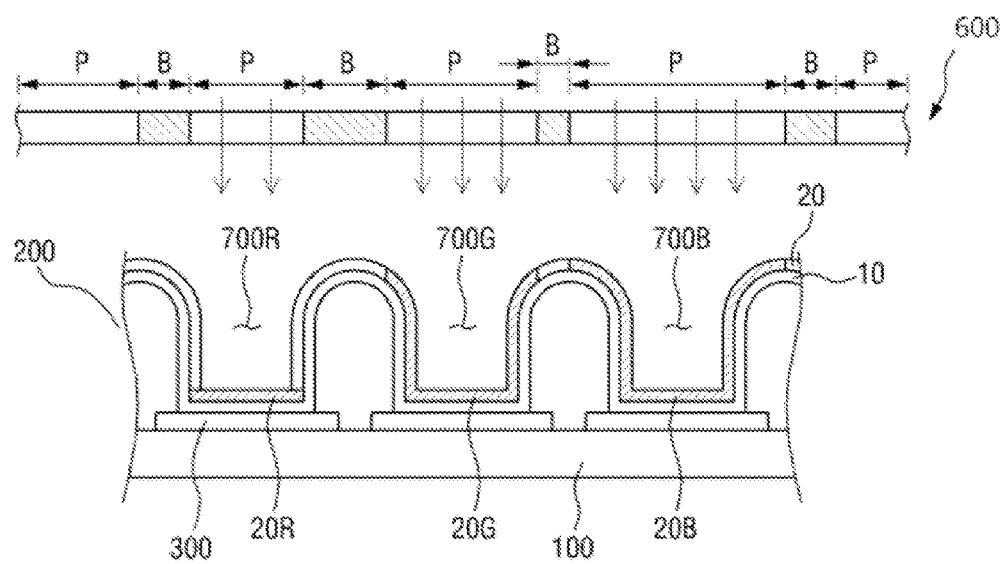

Referring to FIG. 7, patterns may be formed on the primer layer 20 by using a mask 600. The mask 600 may be an optical mask, and the primer layer 20 may include a photosensitive material. Accordingly, parts of the primer layer 20 that are exposed to light may not be removed (e.g., may remain), and parts of the primer layer 20 that are not exposed to light may be removed. As a result, a plurality of primer patterns 20R, 20G and 20B may be formed (e.g., may remain) in the pixels 700R, 700G and 700B, respectively. In an implementation, parts of the primer layer 20 that are exposed to light may be removed, and parts of the primer layer 20 that are not exposed to light may remain unremoved.

The mask 600 may include light-transmitting areas P and light-shielding areas B. The light-transmitting areas P may be areas that substantially transmit light therethrough, and the light-shielding areas B may be areas that substantially block the transmission of light therethrough. The expression "the light-shielding areas B substantially blocking the transmission of light therethrough", as used herein, should be understood as encompassing not only the case when the light-shielding areas B 100% block the transmission of incident light therethrough, but also the case when the light-shielding areas B do not necessarily 100% block the transmission of light therethrough, but transmit too small an amount of light therethrough to cause a reaction with the photosensitive material of the primer layer 20. The expression "the light-transmitting areas P substantially transmitting light therethrough", as used herein, should be understood as encompassing not only the case when the light-transmitting areas P 100% transmit light therethrough, but also the case when the light-transmitting areas P do not necessarily 100% transmit light therethrough, but transmit a sufficient amount of light to cause a reaction with the photosensitive material of the primer layer 20. In an implementation, the mask 600 may also include semitransparent areas, and various other modifications may be made to the mask 600.

As illustrated in FIG. 7, predetermined patterns may be formed on the mask 600 with the light-transmitting areas P and the light-shielding areas B, and the light-transmitting areas P may correspond to areas where the primer patterns 20R, 20G and 20B are formed. In response to parts of the primer layer 20 corresponding to the light-shielding areas B being removed after the formation of patterns on the primer layer 20 by the mask 600, the primer patterns 20R, 20G and 20B, which have different areas from one another, may be formed.

Figure 8:
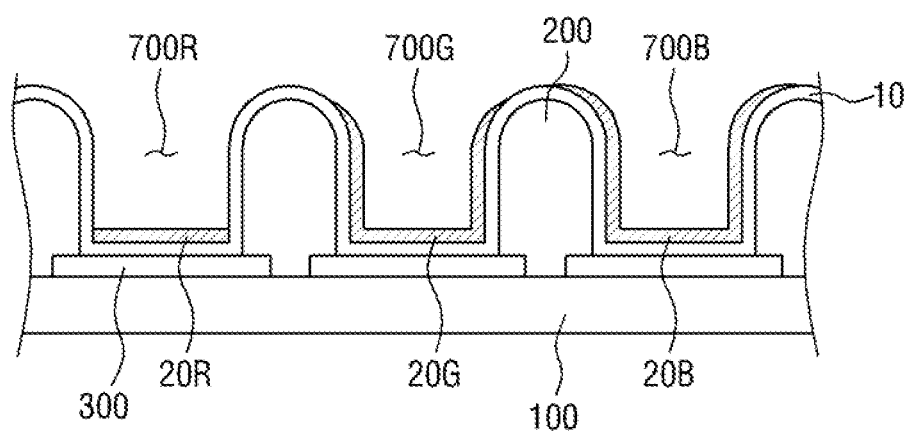

Referring to FIG. 8, in response to the parts of the primer layer 20 corresponding to the light-shielding areas B being removed, the primer patterns 20R, 20G and 20B, which have different areas from one another, may be formed in the pixels 700R, 700G and 700B, respectively. As already mentioned in the description of the organic light-emitting display panel according to an exemplary embodiment, the primer patterns 20R, 20G and 20B may be formed to have different areas and to partially overlap the pixel-defining layer 200 in a horizontal cross-sectional view.

Figure 9:
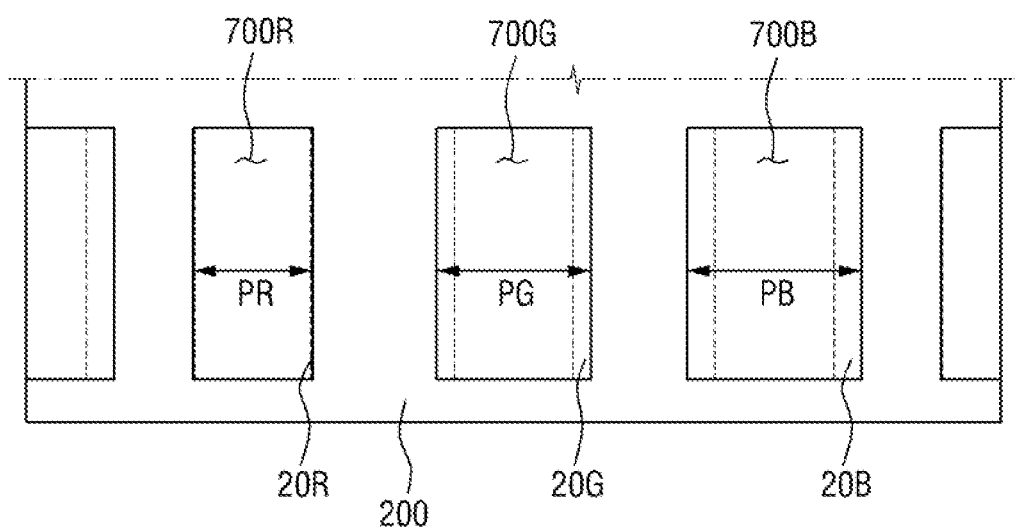

FIG. 9 illustrates a plan view of a structure of FIG. 8. Referring to FIG. 9, the first, second and third primer patterns 20R, 20G and 20B may be formed in or on the pixels 700R, 700G and 700B, respectively, and may have different horizontal cross-sectional areas from one another. For example, the first primer pattern 20R may have substantially the same horizontal cross-sectional area as the inside of the pixel 700R, which is defined by the pixel-defining layer 200, and may have substantially the same width, i.e., a width PR, as the pixel 700R. The second primer pattern 20G may have a larger area than the first primer pattern 20R, and may have a width PG that is greater than the width of the pixel 700G. The third primer pattern 20B may have a larger area than the first primer pattern 20R and the second primer pattern 20G, and may have a width PB that is greater than the width PR of the first primer pattern 20R and the width PG of the second primer pattern 20G.

The step of forming the organic light-emitting layer may also include forming at least one of an emission layer, a hole transport layer, an electron injection layer and an electron transport layer on the primer patterns 20R, 20G and 20B.

Figure 10:
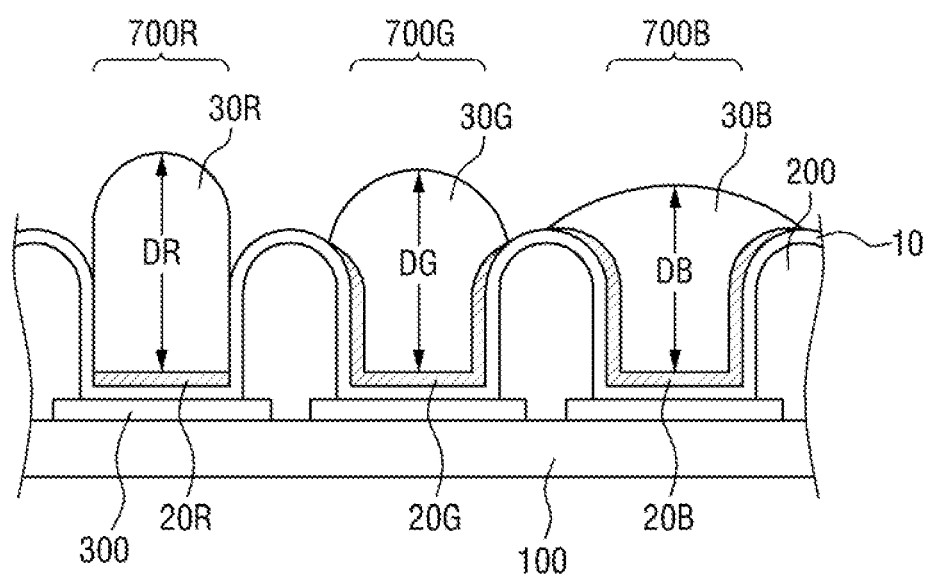

For example, referring to FIG. 10, materials (e.g., in liquid form) for forming hole transport layers 30R, 30G and 30B may be discharged onto the first, second and third primer patterns 20R, 20G and 20B, respectively. The materials for forming the hole transport layers 30R, 30G and 30B may easily contact the primer patterns 20R, 20G and 20B, respectively, (e.g., due to the liquid-philic properties of the primer patterns) and may not as easily contact the pixel-defining layer 200 or the hole injection layer 10, which may have relatively high surface energy and thus exhibits liquid-repelling properties. The first, second and third primer patterns 20R, 20G and 20B may have different areas from one another, and the third primer pattern 20B has a greater area than the first and second primer patterns 20R and 20G, the hole transport layer 30B, which is formed on the third primer pattern 20B, may have a larger contact area than the hole transport layers 30R and 30G, which are formed on the first and second primer patterns 20R and 20G, respectively. Accordingly, in a case when the hole transport layers 30R, 30G and 30B are formed by discharging the same amount of material (e.g., liquid), the hole transport layers 30R, 30G and 30B may have different heights relative to one another. As a result, the thickness of the hole transport layers 30R, 30G and 30B may gradually decrease in a direction from the first primer pattern 20R to the third primer pattern 20B. For example, DR>DG>DB where DR, DG and DB are the thicknesses of the hole transport layers 30R, 30G and 30B, respectively.

Figure 11:
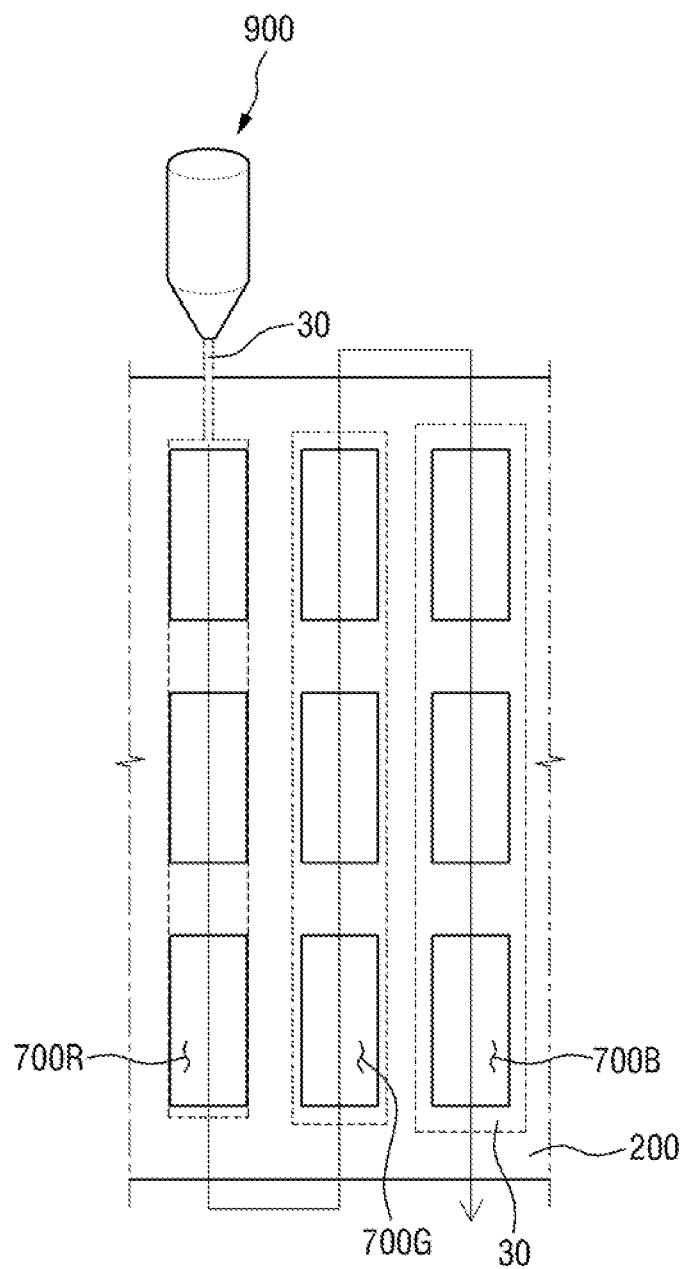
Figure 12:
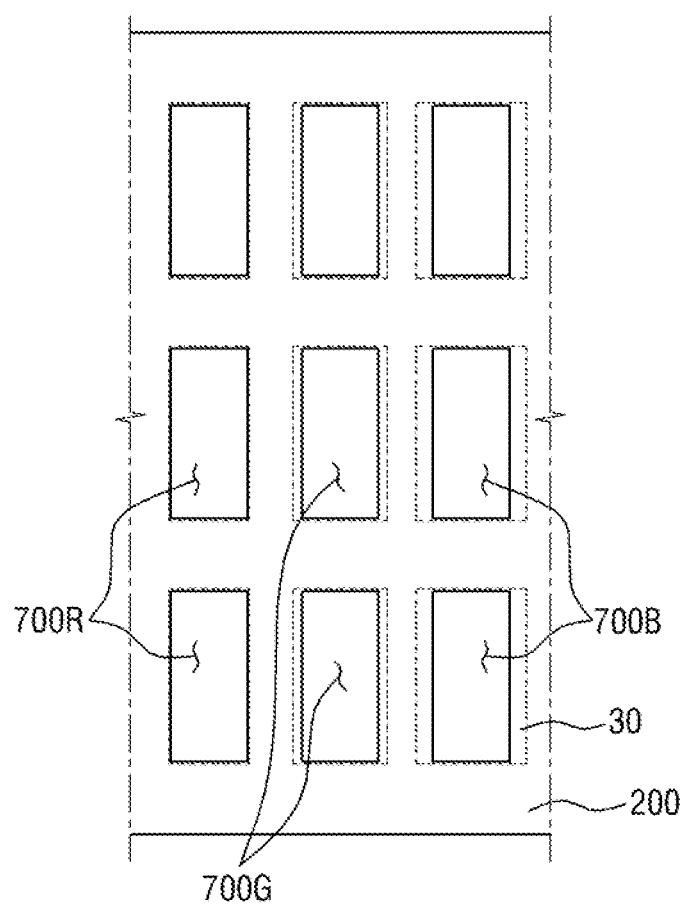
Figure 13:
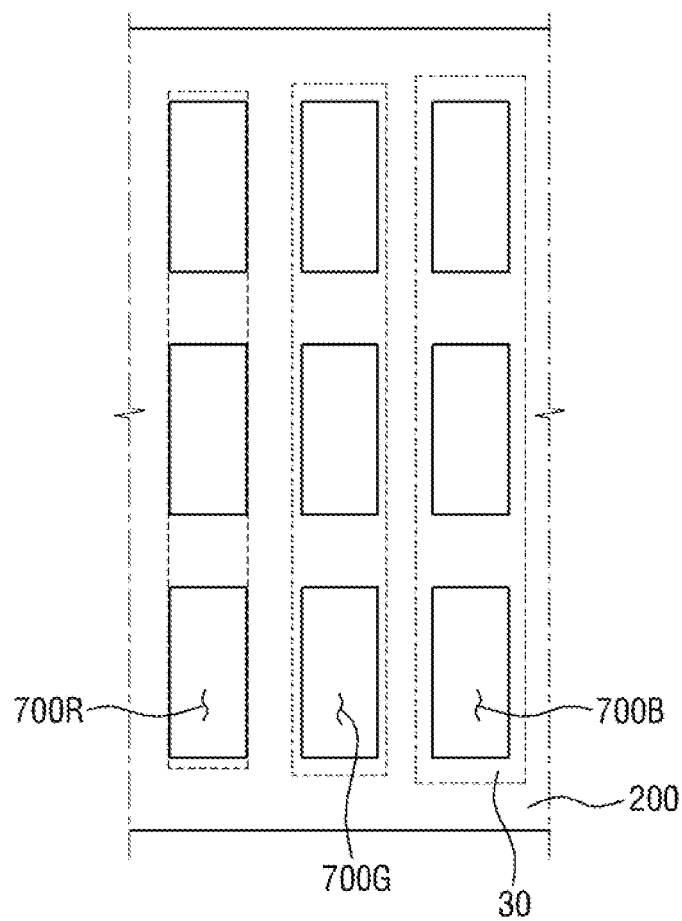

FIGS. 11 to 13 illustrate a process of forming a hole transport layer 30. Referring to FIGS. 11 to 13, the hole transport layer 30 may be formed by using a single nozzle 700. As illustrated in FIG. 11, the single nozzle 700 may continuously discharge substantially the same amounts of liquid drops, dispersion, or solution for forming the hole transport layer 30 over the pixels. For example, the nozzle 700 may discharge liquid drops over the pixels that are arranged in a matrix form, while moving in a column direction. The discharged liquid drops may form their position or settle on the first, second and third primer patterns 20R, 20G and 20B, which are already formed. As a result, as illustrated in FIG. 12, the hole transport layer 30 may be formed to have different areas in different pixels.

Some nozzle-based methods may rely on differences in the amount of liquid drops discharged. However, the single nozzle 700 method according to an embodiment may uniformly discharge the same amount of liquid or solution, and may thus form an organic light-emitting layer to a uniform thickness, thereby reducing the possibility of and/or preventing a defect.

In an implementation, as illustrated in FIG. 13, liquid for forming the hole transport layer 30 may be discontinuously discharged, and may thus be arranged in the form of islands. In an implementation, the discharging of the liquid drops may be performed by moving the single nozzle 700 in a row direction and then in a column direction. For example, pixels may be arranged in rows and columns, and at least one of the hole transport layer 30, the electron injection layer 60 and the electron transport layer 50 may extend in the row direction or the column direction without discontinuity.

The hole transport layer 30 is illustrated in the drawings as being formed by being discharged from the single nozzle 700. In an implementation, the emission layer, the electron injection layer 60 and the electron transport layer 50 may also be formed by using the single nozzle 700.

Figure 14:
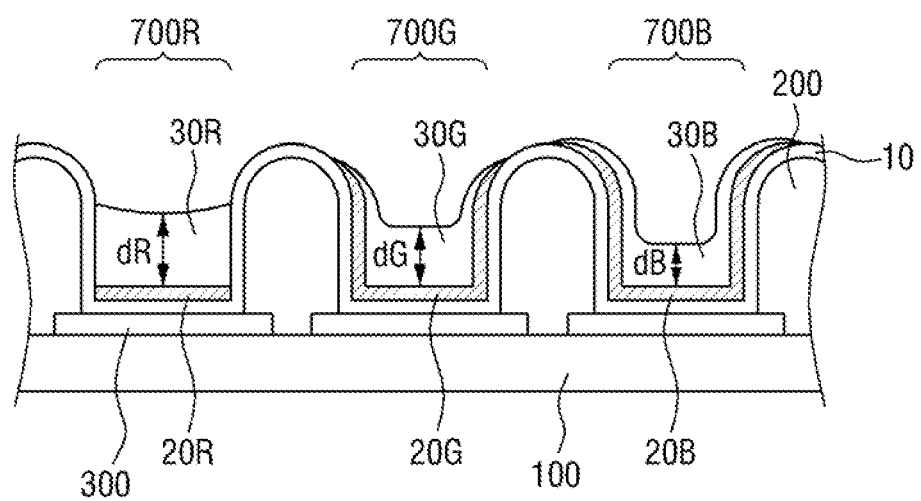

The method of fabricating an organic light-emitting display panel, according to an exemplary embodiment, may also include drying the organic light-emitting layer. For example, referring to FIG. 14, the hole transport layers 30R, 30G and 30B, which are formed in the pixels 700R, 700G and 700B, respectively, may have different thicknesses from one another.

Figure 15:
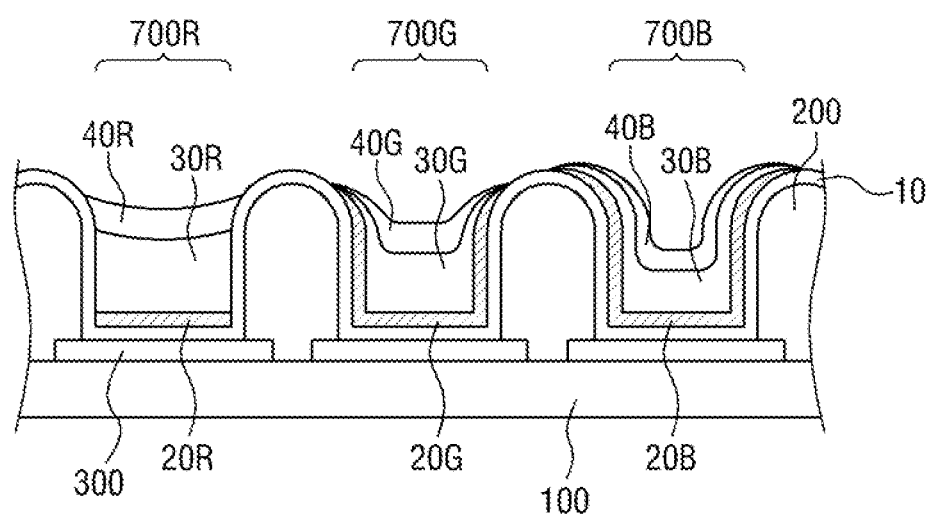

Referring to FIG. 15, emission layers 40R, 40G and 40B may be formed by substantially the same method used to form the hole transport layers 30R, 30G and 30B. For example, a liquid or solution for forming the emission layers 40R, 40G and 40B may be discharged onto the hole transport layers 30R, 30G and 30B, respectively, and may then be dried, thereby forming the emission layers 40R, 40G and 40B, as illustrated in FIG. 15.

Figure 16:
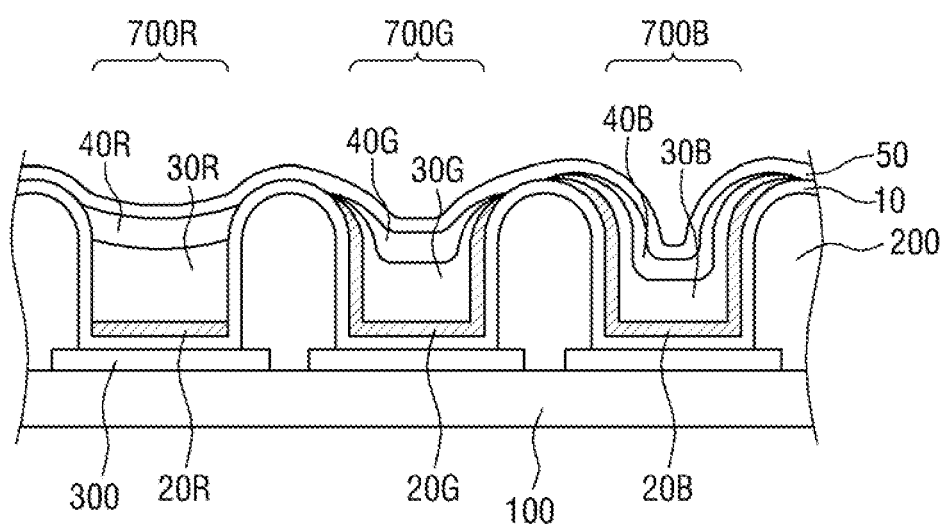
Figure 17:
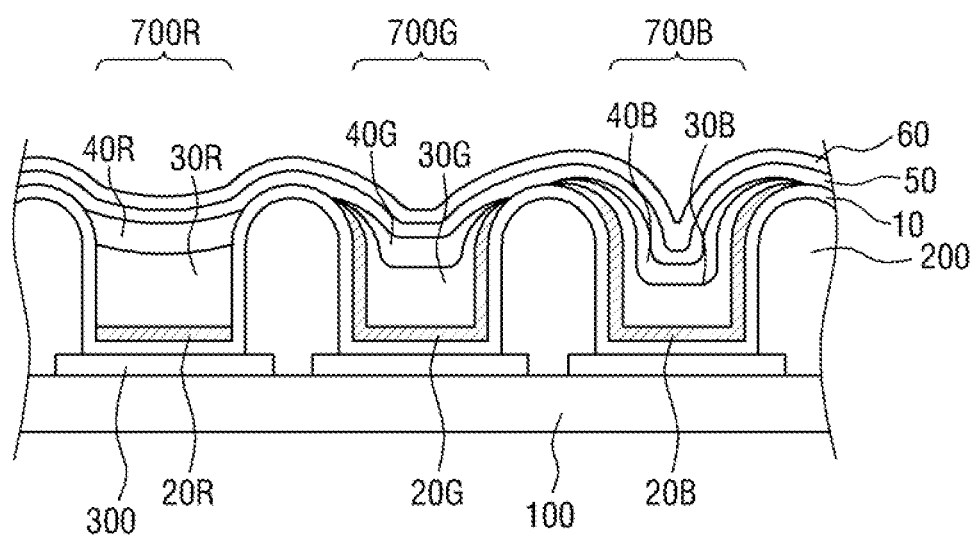

Thereafter, referring to FIGS. 16 and 17, the electron transport layer 50 and the electron injection layer 60 may be formed on the emission layers 40R, 40G and 40B. In an implementation, the electron transport layer 50 and the electron injection layer 60 may be formed by the same method (e.g., using a nozzle) used to form the hole transport layers 30R, 30G and 30B and the emission layers 40R, 40G and 40B. In an implementation, the electron transport layer 50 and the electron injection layer 60 may be formed by, e.g., deposition or sputtering.

Figure 18:
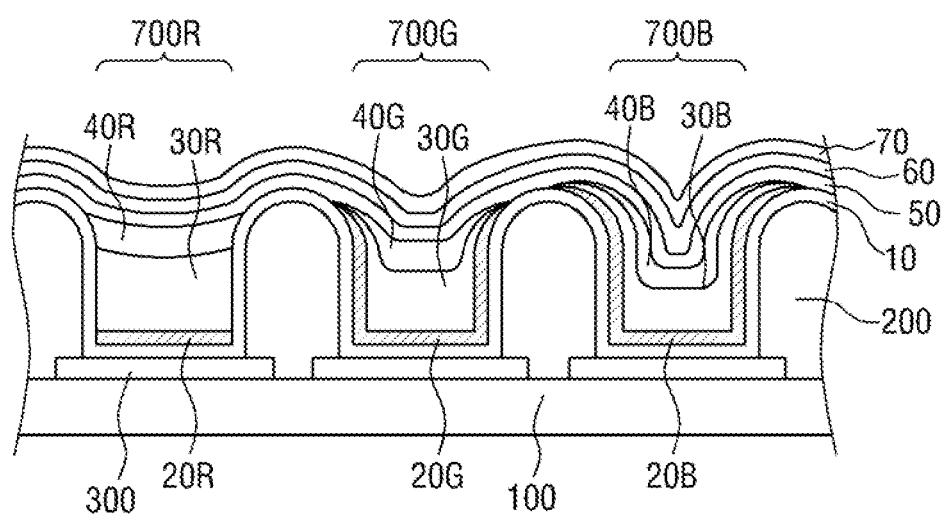

Thereafter, referring to FIG. 18, a second electrode layer 70 may be formed on the electron injection layer 60. The second electrode layer 70 may be formed by deposition or sputtering.

In an implementation, the hole transport layers 30R, 30G, and 30B, the emission layers 40R, 40G and 40B, the electron transport layer 50 and the electron injection layer 60, as illustrated in FIGS. 10 to 18, may be sequentially formed on the primer patterns 20R, 20G and 20B. In an implementation, some of the hole transport layers 30R, 30G, and 30B, the emission layers 40R, 40G and 40B, the electron transport layer 50 and the electron injection layer 60 may not be formed, or the order in which to form the hole transport layers 30R, 30G, and 30B, the emission layers 40R, 40G and 40B, the electron transport layer 50 and the electron injection layer 60 may be varied.

By way of summation and review, an organic light-emitting display device may include an anode electrode, a cathode electrode, and a hole injection layer, a hole transport layer, an emission layer, an electron transport layer, and an electron injection layer interposed between the anode electrode and the cathode layer. Holes may be provided to the emission layer through the anode electrode, and electrons may be provided to the emission layer through the cathode electrode. The electrons and the holes may recombine in the emission layer, and as a result, excitons may be generated. In response to the transition of the excitons from an excited state to a ground state, energy may be generated, and as a result, light may be generated by the emission layer.

Recently, ways to realize high-purity colors by improving the efficiency of an organic light-emitting display device, and at the same time, simplifying the fabrication of the organic light-emitting display device have been considered.

The embodiments may provide an organic light-emitting display panel capable of realizing high-purity colors.

The embodiments may provide a method of fabricating an organic light-emitting display panel, in which an organic light-emitting display panel can be fabricated with the use of a single nozzle, and through simplified processes.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display panel, comprising:
a base substrate;
a first electrode layer including a plurality of first electrodes arranged on the base substrate;
a liquid-repelling pixel-defining layer including partition walls that define a plurality of pixels;
an organic light-emitting layer including a plurality of organic light-emitting patterns in the pixels, respectively; and
a second electrode layer on the organic light-emitting layer,
wherein the organic light-emitting layer includes a plurality of primer patterns, the plurality of primer patterns:
being respectively disposed in the pixels,
being separate from one another, and
respectively overlapping the first electrodes,
wherein at least one of the primer patterns has an area different area from an area of the other primer patterns, and
wherein the primer patterns have an affinity for liquid that is higher than an affinity for liquid of the liquid-pixel-defining layer.

2. The organic light-emitting display panel as claimed in claim 1, wherein:
the organic light-emitting layer includes first through third organic light-emitting patterns, which alternately appear at least once, and
at least one of the first through third organic light-emitting patterns has a thickness different from a thickness of the other organic light-emitting patterns.

3. The organic light-emitting display panel as claimed in claim 2, wherein a thickness of the first organic light-emitting pattern is represented by Equation (1):

$$L1=(\lambda R/2)\times m \qquad (1)$$

in which L1 denotes the thickness of the first organic light-emitting pattern, $\lambda R$ denotes the wavelength of red light, and m is a natural number.

4. The organic light-emitting display panel as claimed in claim 2, wherein a thickness of the second organic light-emitting pattern is represented by Equation (2):

$$L2=(\lambda G/2)\times m \qquad (2)$$

in which L2 denotes the thickness of the second organic light-emitting pattern, $\lambda G$ denotes the wavelength of green light, and m is a natural number.

5. The organic light-emitting display panel as claimed in claim 2, wherein a thickness of the third organic light-emitting pattern is represented by Equation (3):

$$L3=(\lambda B/2)\times m \qquad (3)$$

in which L3 denotes the thickness of the second organic light-emitting pattern, $\lambda B$ denotes the wavelength of blue light, and m is a natural number.

6. The organic light-emitting display panel as claimed in claim 1, wherein the organic light-emitting layer further includes a hole injection layer between the primer patterns and the first electrodes.

7. The organic light-emitting display panel as claimed in claim 6, wherein, between the primer patterns and the second electrode layer, the organic light-emitting layer further includes at least one of an emission layer, a hole transport layer, an electron injection layer, and an electron transport layer.

8. The organic light-emitting display panel as claimed in claim 7, wherein at least one of the emission layer, the hole transport layer, the electron injection layer and the electron transport layer has liquid-philic properties.

9. The organic light-emitting display panel as claimed in claim 1, wherein:
the primer patterns include first through third primer patterns, which alternately appear at least once, and
the first through third primer patterns have areas that are different from one another.

10. The organic light-emitting display panel as claimed in claim 9, wherein at least one of the first through third primer patterns partially overlaps the pixel-defining layer in a cross-sectional view along a plane parallel to the base substrate.

11. The organic light-emitting display panel as claimed in claim 10, wherein:
two of the first through third primer patterns partially overlap the pixel-defining layer in a cross-sectional view along a plane parallel to the base substrate, and
one of the two primer patterns has a larger area of contact with the pixel-defining layer than the other primer pattern.

12. A method of fabricating an organic light-emitting display panel, the method comprising:
providing a base substrate including a plurality of first electrodes thereon;
forming a liquid-repelling pixel-defining layer such that the pixel-defining layer includes partition walls that define a plurality of pixels and that extend from the base substrate that includes the plurality of first electrodes thereon;
forming an organic light-emitting layer such that the organic light-emitting layer includes a plurality of organic light-emitting patterns that are respectively formed in the pixels; and
forming a second electrode layer on the organic light-emitting layer,
wherein:
the organic light-emitting layer includes a plurality of primer patterns, which are formed separately in the pixels, respectively, and that overlap the first electrodes, respectively,
at least one of the primer patterns has an area that is different from an area of the other primer patterns, and
the primer patterns have an affinity for liquid that is higher than an affinity for liquid of the liquid-repelling pixel-defining layer.

13. The method as claimed in claim 12, further comprising forming a hole injection layer such that the hole injection layer covers the first electrodes and the pixel-defining layer and is between the base substrate and the primer patterns.

14. The method as claimed in claim 12, wherein forming the organic light-emitting layer includes:
- applying a primer layer that includes a liquid-philic material;
- patterning the primer layer by using a mask, the mask including light-transmitting areas corresponding to the primer patterns; and
- removing portions of the primer layer except for portions corresponding with the primer patterns.

15. The method as claimed in claim 12, wherein:
- the organic light-emitting layer includes first through third organic light-emitting patterns, which alternately appear at least once, and
- at least one of the first through third organic light-emitting patterns has a thickness different from a thickness of the other organic light-emitting patterns.

16. The method as claimed in claim 12, wherein forming the organic light-emitting layer includes forming, on the primer patterns, at least one of an emission layer, a hole transport layer, an electron injection layer, and an electron transport layer.

17. The method as claimed in claim 16, wherein forming the organic light-emitting layer further includes forming at least one of the emission layer, hole transport layer, electron injection layer, and the electron transport layer by using a single nozzle.

18. The method as claimed in claim 16, wherein:
- the pixels are arranged in a matrix form, and
- at least one of the hole transport layer, the electron injection layer, and the electron transport layer extends in a row direction or a column direction.

19. The method as claimed in claim 12, wherein:
- the primer patterns include first through third primer patterns, which alternately appear at least once, and
- at least one of the first through third primer patterns have an area that is different from an area of the other primer patterns.

20. The method as claimed in claim 19, wherein at least one of the first through third primer patterns partially overlaps the pixel-defining layer.

21. An organic light-emitting display panel, comprising:
- a base substrate;
- a first electrode layer including a plurality of first electrodes arranged on the base substrate;
- a pixel-defining layer including partition walls that extend from the base substrate and that define a plurality of pixels;
- a hole injection layer covering the first electrodes and the pixel-defining layer and disposed between the base substrate and a primer patterns;
- an organic light-emitting layer including a plurality of organic light-emitting patterns in the pixels, respectively; and
- a second electrode layer on the organic light-emitting layer,
- wherein the organic light-emitting layer includes the plurality of primer patterns, the plurality of primer patterns:
  - being respectively formed in the pixels,
  - being separate from one another, and
  - respectively overlapping the first electrodes,
- wherein at least one of the primer patterns has an area different area from an area of the other primer patterns, and
- wherein the primer patterns have an affinity for liquid that is higher than an affinity for liquid of the pixel-defining layer.

* * * * *